US012400929B2

(12) United States Patent
Shin et al.

(10) Patent No.: US 12,400,929 B2
(45) Date of Patent: Aug. 26, 2025

(54) SEMICONDUCTOR DEVICE AND METHOD OF FORMING GRAPHENE-COATED CORE EMBEDDED WITHIN TIM

(71) Applicant: STATS ChipPAC Pte. Ltd., Singapore (SG)

(72) Inventors: YongMoo Shin, Incheon (KR); HeeSoo Lee, Incheon (KR); HyunSeok Park, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 385 days.

(21) Appl. No.: 17/932,987

(22) Filed: Sep. 16, 2022

(65) Prior Publication Data

US 2024/0096736 A1     Mar. 21, 2024

(51) Int. Cl.
*H01L 23/373*     (2006.01)
*H01L 21/48*     (2006.01)
(Continued)

(52) U.S. Cl.
CPC ...... *H01L 23/3733* (2013.01); *H01L 21/4882* (2013.01); *H01L 23/3675* (2013.01);
(Continued)

(58) Field of Classification Search
CPC ......... A61B 17/02; A61B 90/30; A61B 90/57; A61B 2090/309; A61B 2017/00876;
(Continued)

(56) References Cited

U.S. PATENT DOCUMENTS

| 6,114,413 | A | 9/2000 | Kang et al. |
| 7,886,813 | B2 | 2/2011 | Hua et al. |
| | | (Continued) | |

FOREIGN PATENT DOCUMENTS

| KR | 10-1465616 B1 | 11/2014 |
| KR | 10-2395247 B1 | 5/2022 |

OTHER PUBLICATIONS

Graphmatech, "Graphmatech's Graphene Technology Unlocks the Potential of Copper Additive Manufacturing" Website: https://graphmatech.com/graphmatechs-graphene-technology-unlocks-the-potential-of-copper-additive-manufacturing/, Feb. 9, 2021, Uppsala, Sweden.

*Primary Examiner* — Jeff W Natalini
*Assistant Examiner* — Nicholas Leland Hutson
(74) *Attorney, Agent, or Firm* — Robert D. Atkins; PATENT LAW GROUP

(57) ABSTRACT

A semiconductor device has a substrate and electrical component disposed over the substrate. The electrical component can be a semiconductor die, semiconductor package, surface mount device, RF component, discrete electrical device, or IPD. A TIM is deposited over the electrical component. The TIM has a core, such as Cu, covered by graphene. A heat sink is disposed over the TIM, electrical component, and substrate. The TIM is printed on the electrical component. The graphene is interconnected within the TIM to form a thermal path from a first surface of the TIM to a second surface of the TIM opposite the first surface of the TIM. The TIM has thermoset material or soldering type matrix and the core covered by graphene is embedded within the thermoset material or soldering type matrix. A metal layer can be formed between the TIM and electrical component.

24 Claims, 8 Drawing Sheets

(51) Int. Cl.
  *H01L 23/16*    (2006.01)
  *H01L 23/367*   (2006.01)
  *H01L 25/16*    (2023.01)
  *H01L 23/00*    (2006.01)

(52) U.S. Cl.
  CPC ...... *H01L 23/3677* (2013.01); *H01L 23/3737* (2013.01); *H01L 25/165* (2013.01); *H01L 24/16* (2013.01); *H01L 2224/16235* (2013.01); *H01L 2924/1611* (2013.01); *H01L 2924/1616* (2013.01); *H01L 2924/16235* (2013.01); *H01L 2924/16251* (2013.01); *H01L 2924/1632* (2013.01)

(58) Field of Classification Search
  CPC ... A61B 17/0218; A61B 17/0281; A61B 1/32; A61B 34/70; H01L 23/3733; H01L 21/4882; H01L 23/3675; H01L 23/3677; H01L 23/3737; H01L 25/165; H01L 24/16; H01L 2224/16235; H01L 2924/16251; H01L 25/0655; H01L 23/373
  See application file for complete search history.

(56) References Cited

U.S. PATENT DOCUMENTS

| | | |
|---|---|---|
| 8,535,553 B2 | 9/2013 | Kong et al. |
| 10,421,123 B2 | 9/2019 | Jeong et al. |
| 2017/0130034 A1* | 5/2017 | Hwang ............... C08K 9/10 |
| 2017/0167716 A1* | 6/2017 | Ezaki ............... F21V 29/87 |
| 2020/0227338 A1* | 7/2020 | Gong ............... H01L 23/3735 |
| 2022/0002157 A1* | 1/2022 | Corrigan ............... C01B 32/182 |
| 2023/0320106 A1* | 10/2023 | Mun ............... H10B 12/50 |
| | | 257/296 |

* cited by examiner

SEMICONDUCTOR DEVICE AND METHOD OF FORMING GRAPHENE-COATED CORE EMBEDDED WITHIN TIM

FIELD OF THE INVENTION

The present invention relates in general to semiconductor devices and, more particularly, to a semiconductor device and method of heat dissipation using graphene-coated core embedded within thermal interface material (TIM).

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

The SIP module includes high speed digital and RF electrical components, highly integrated for small size and low height, and operating at high clock frequencies and high power rating. The electrical components are known to generate substantial heat, which must be properly dissipated. Copper is good material to solderability and wettability of solder paste. A need still exists to improve heat dissipation, particularly in applications involving high speed digital and RF electrical components.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
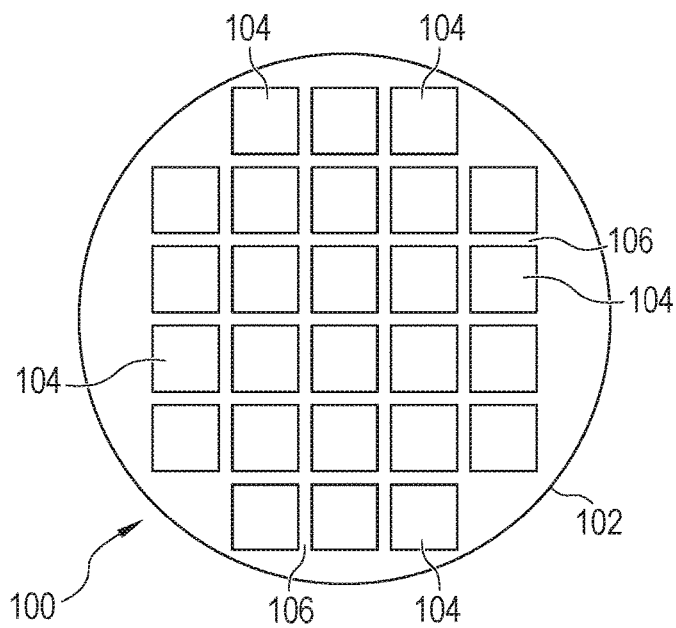
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
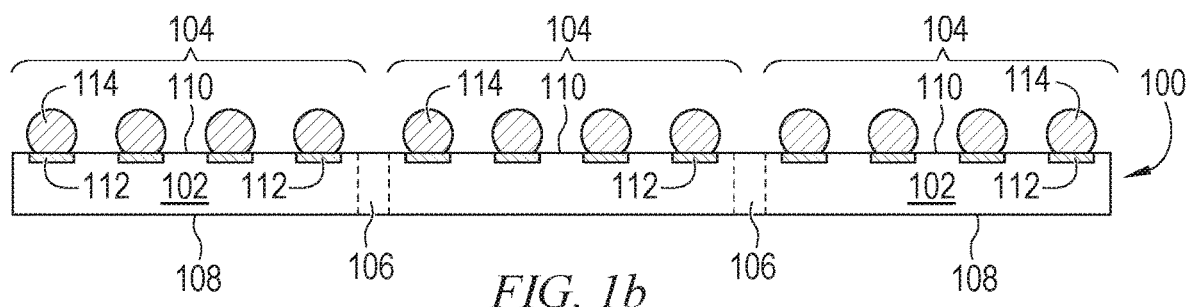

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material.

Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 2A:
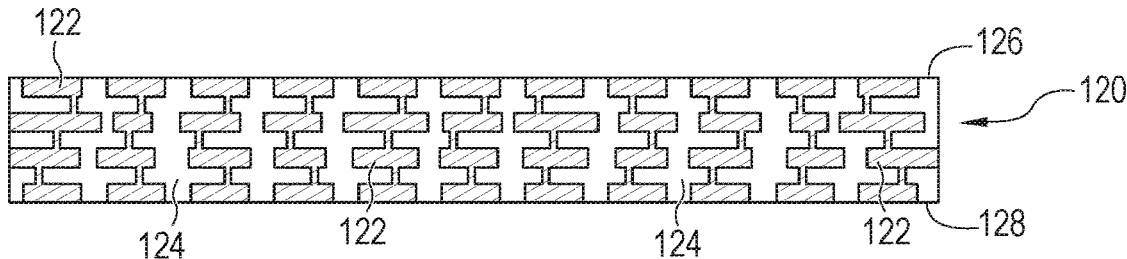
FIGS. 2a-2g illustrate a process of forming a graphene Cu core within TIM for a SiP.

FIGS. 2a-2g illustrate a process of forming an SiP module with graphene with the TIM over electrical component for thermal dissipation. FIG. 2a shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

Figure 1C:
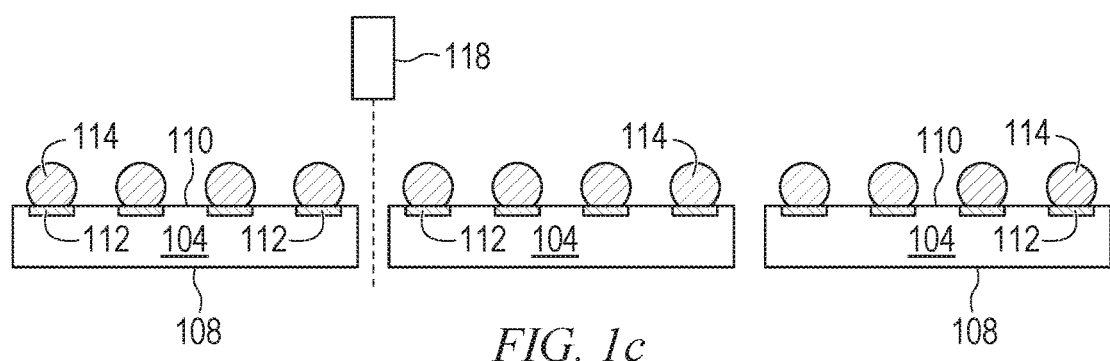
Figure 2B:
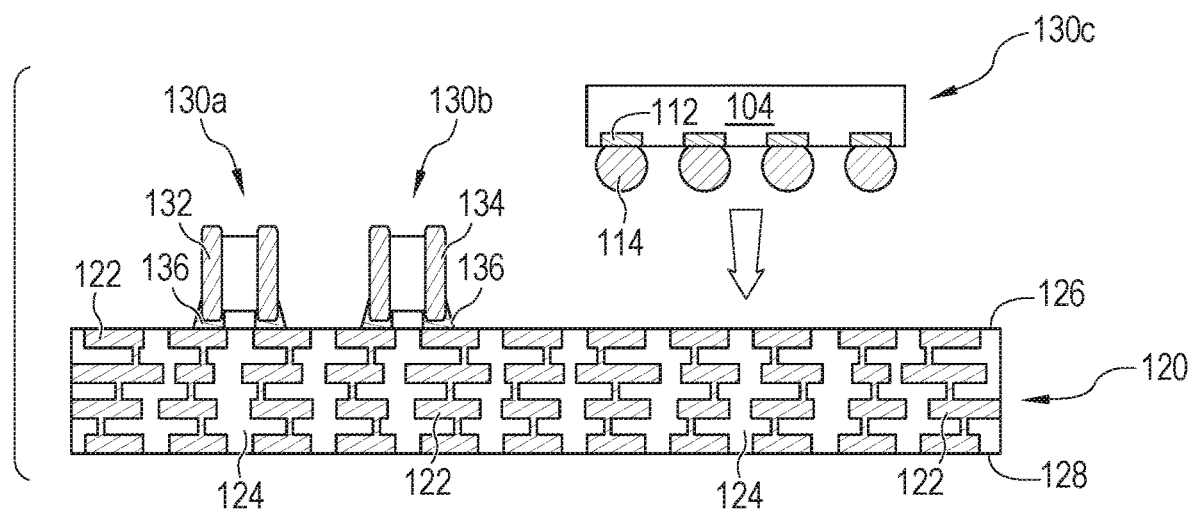
Figure 2C:
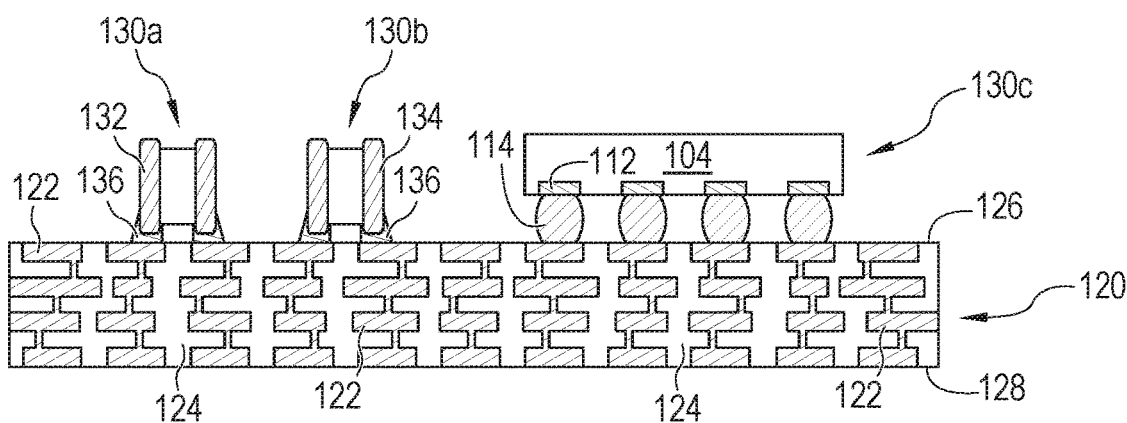

In FIG. 2b, electrical components 130a-130c are disposed on surface 126 of interconnect substrate 120 and electrically and mechanically connected to conductive layers 122. Electrical components 130a-130c are positioned over substrate 120 using a pick and place operation. For example, electrical components 130a and 130b can be discrete electrical devices, or IPDs, such as a diode, transistor, resistor, capacitor, and inductor. Electrical component 130c can be semiconductor die 104 from FIG. 1c with bumps 114 oriented toward surface 126 of substrate 120. Alternatively, electrical components 130a-130c can include other semiconductor die, semiconductor packages, surface mount devices, RF components, discrete electrical devices, or integrated passive devices (IPD). FIG. 2c illustrates electrical components 130a-130c electrically and mechanically connected to conductive layers 122 of substrate 120. Conductive paste or solder 136 provides electrical and mechanical connection to terminals 132 and 134 of electrical components 130a and 130b, respectively. Bumps 114 provide electrical and mechanical connection for electrical component 130c.

Figure 2D:
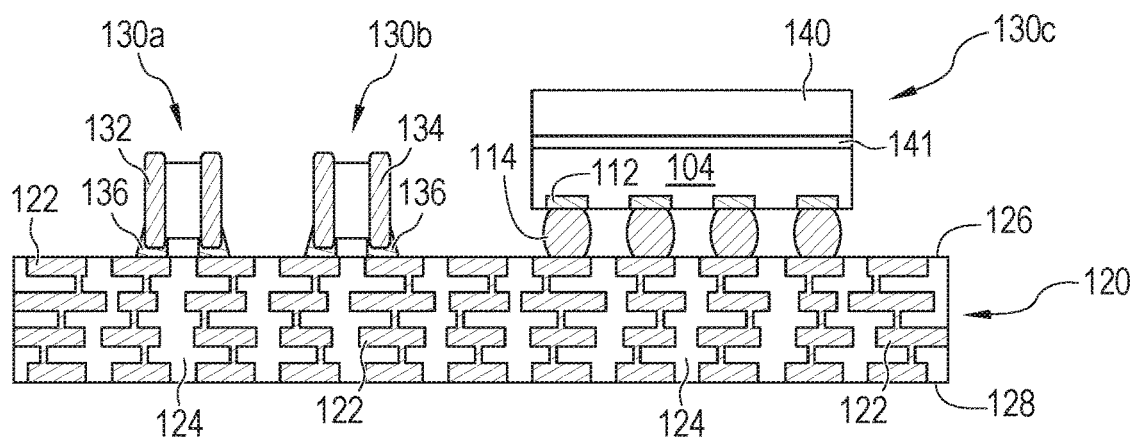
Figure 3A:
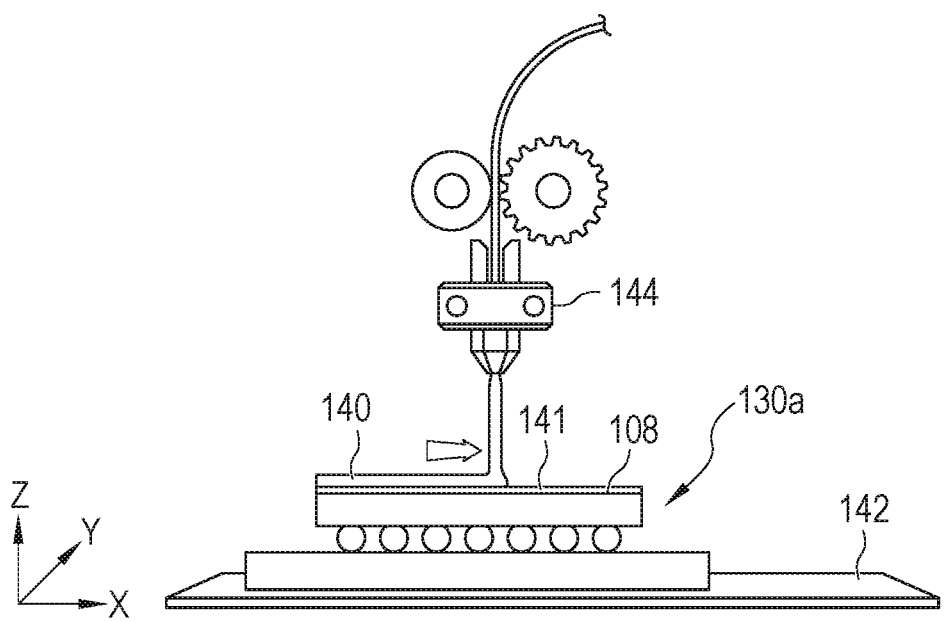
FIGS. 3a-3e illustrate a process of forming a graphene Cu core.

In FIG. 2d, TIM 140 is deposited over surface 108 of electrical component 130c. Alternatively, metal coating 141 is first deposited over surface 108 of electrical component 130c, depending on the type of TIM. Metal coating 141 can be Ti, Ag, or SUS/Cu. TIM 140 is deposited over metal coating 141. In one embodiment, TIM 140 is printed on surface 108 of electrical component 130c using a 3D printer. FIG. 3a illustrates electrical component 130c disposed on printer bed 142. Printer bed 142 is heated to 80-100° C. TIM 140 is dispensed from printer nozzle 144 onto surface 108 of electrical component 130c. Printer bed 142 moves three dimensionally (x, y, z directions) to control distribution of TIM 140 on surface 108.

Figure 3B:
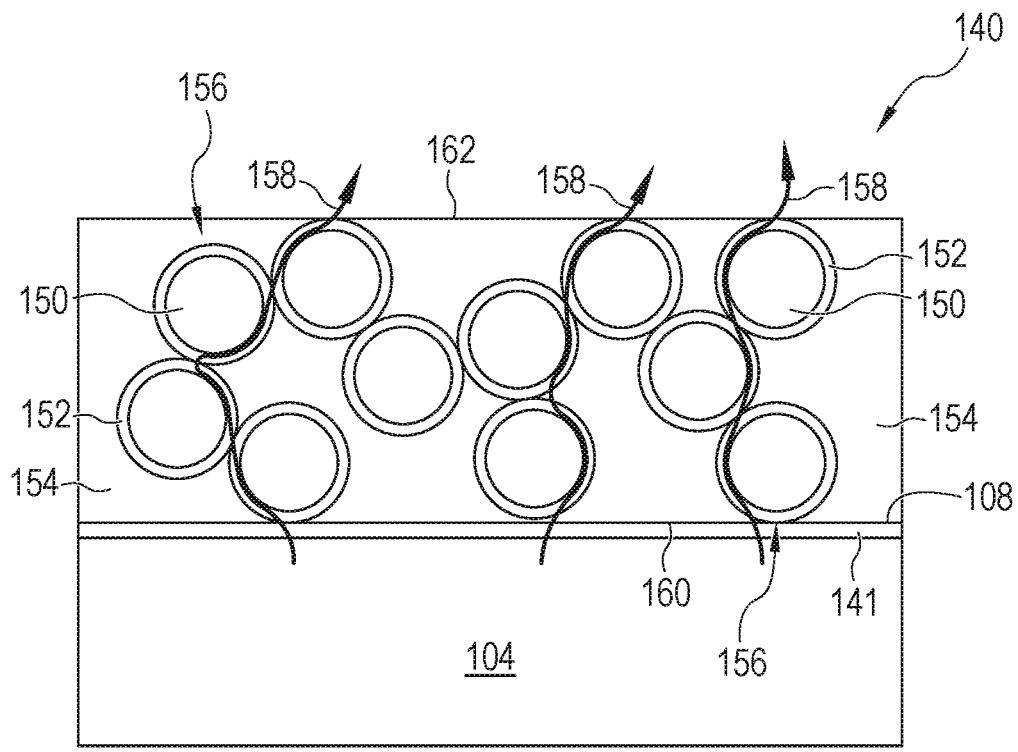
Figure 3C:
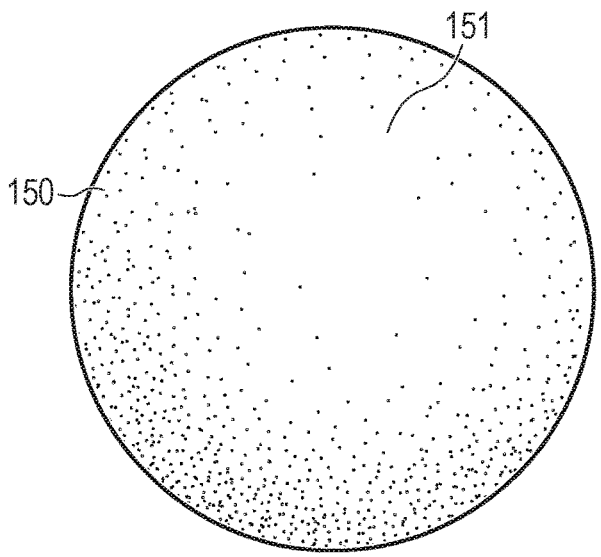

FIG. 3b illustrates further detail of TIM 140 including a plurality of cores 150 surrounded or covered by graphene 152 embedded in matrix 154. In one embodiment, matrix 154 is a thermoset material, such epoxy resin or adhesive with filler containing alumina, Al, aluminum zinc oxide, or other material having good heat transfer properties. Matrix 154 can be thermal grease such as silicon or polymer type such as polymethyl methacrylate (PMMA) or polyethylene terephthalate (PET). FIG. 3c illustrates core 150. In one embodiment, core 150 is Cu, Ni, phase change material (PCM), or other suitable metal or similar material.

Figure 3D:
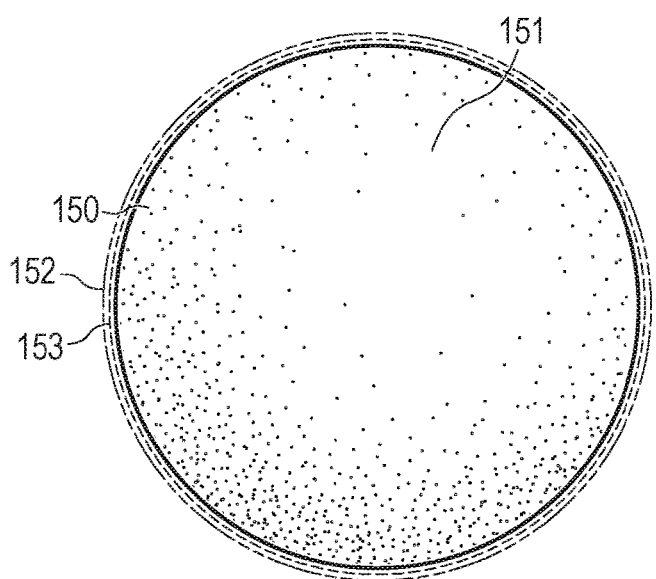
Figure 3E:
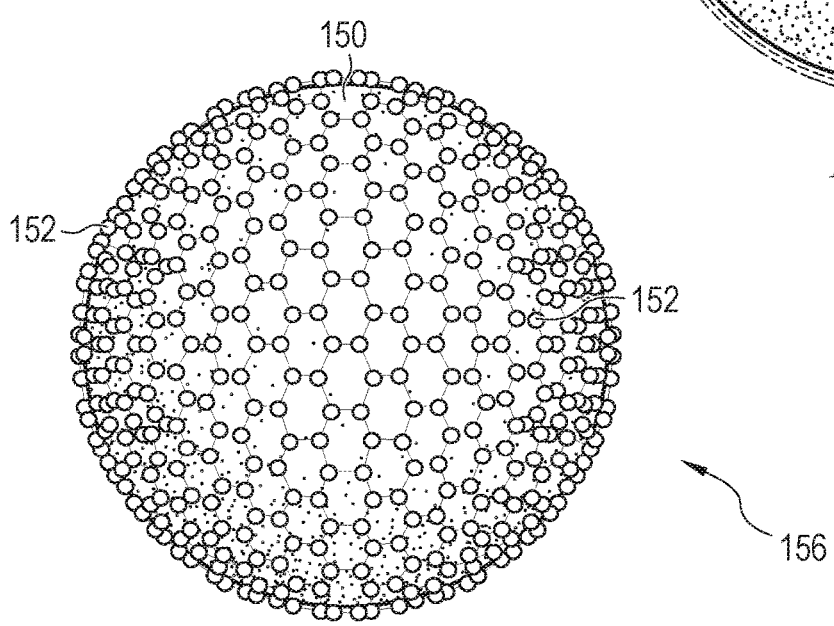

FIG. 3d illustrates graphene coating 152 formed around surface 151 of metal core 150. FIG. 3e illustrates further detail of graphene coating 152 formed as a mesh network around surface 151 of metal core 150, collectively graphene Cu core 156. Graphene 152 is an allotrope of carbon with one or more layers of carbon atoms each arranged in a two-dimensional (2D) honeycomb lattice. Graphene 152 can be formed by CVD. Metal core 150 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene 152 on surface 151 of metal core 150. The release of carbon atoms over metal core 150 forms continuous sheet of graphene 152. Additional information related to forming graphene by CVD is disclosed in U.S. Pat. No. 8,535,553, and hereby incorporated by reference.

In another embodiment, matrix 154 is a polymer with dispersed graphene, carbon nanotubes, conductive polymers, and the like. Core 150 is PCM capable of phase change from solid to liquid phase or from liquid phase to solid phase within the operating temperature range of the semiconductor chip, e.g., 20-200° C. A first coating 152 is formed around PCM core 150, and a second coating 153 is formed between the first coasting 152 and PCM core 150, as shown in FIG. 3d and discussed in published Korean application KR101465616B1. Second coating 153 is a polymer intermediate layer. Matrix 154 with graphene covered core is further disclosed in U.S. patent Ser. No. 10/421,123, and hereby incorporated by reference. Matrix 154 with graphene covered core offers high thermal transfer.

The properties of graphene are summarized in Table 1, as follows:

TABLE 1

| Properties of graphene Parameter | |
|---|---|
| Electronic mobility | $2 \times 10^5$ $cm^2 V^{-1} s^{-1}$ |
| Current density | $10^9$ $A\ cm^{-1}$ |
| Velocity of fermion (electron) | $10^6$ $m\ s^{-1}$ |

TABLE 1-continued

Properties of graphene

| Parameter | |
|---|---|
| Thermal conductivity | 4000-5000 W m$^{-1}$ K$^{-1}$ |
| Tensile strength | 1.5 Tpa |
| Breaking strength | 42N m$^{-1}$ |
| Transparency | 97.7% |
| Elastic limit | 20% |
| Surface area | 2360 m$^2$ g$^{-1}$ |

Graphene 152 exhibits high thermal conductivity. A plurality of graphene Cu cores 156 physically interconnects within thermoset material 154, as shown in FIG. 3b, to create a thermal path 158 between surface 160 and surface 162 of TIM 140. Heat from electrical component 130c is dissipated from surface 108 and surface 160 through thermal path 158 by way of connecting graphene Cu cores 156 to surface 162.

Figure 2E:
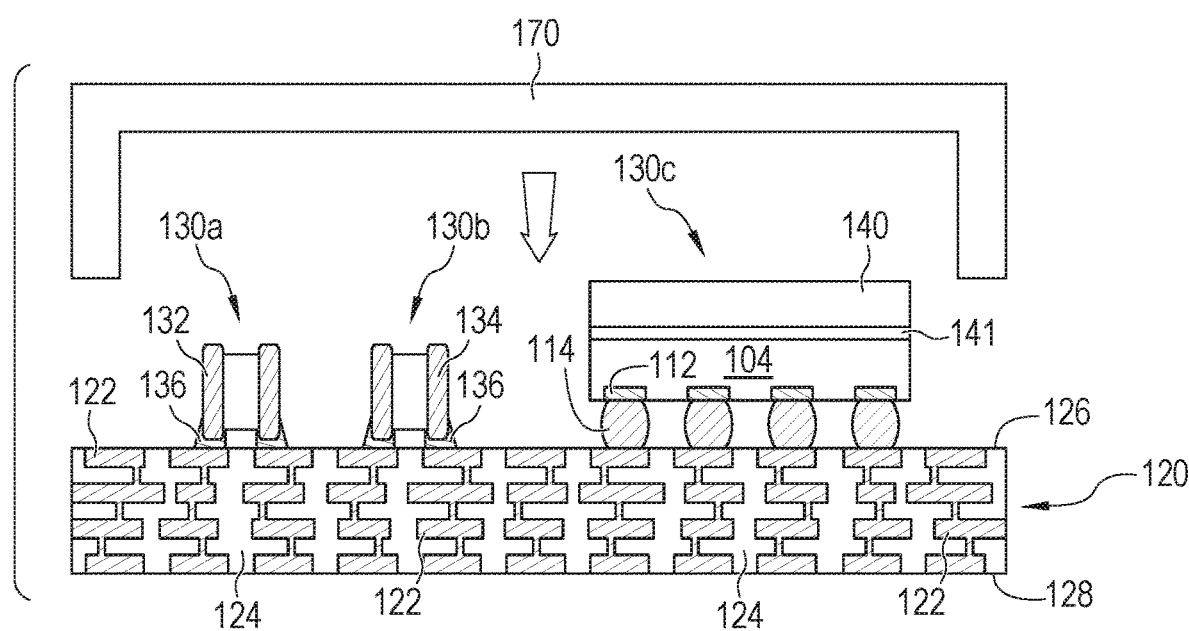
Figure 2F:
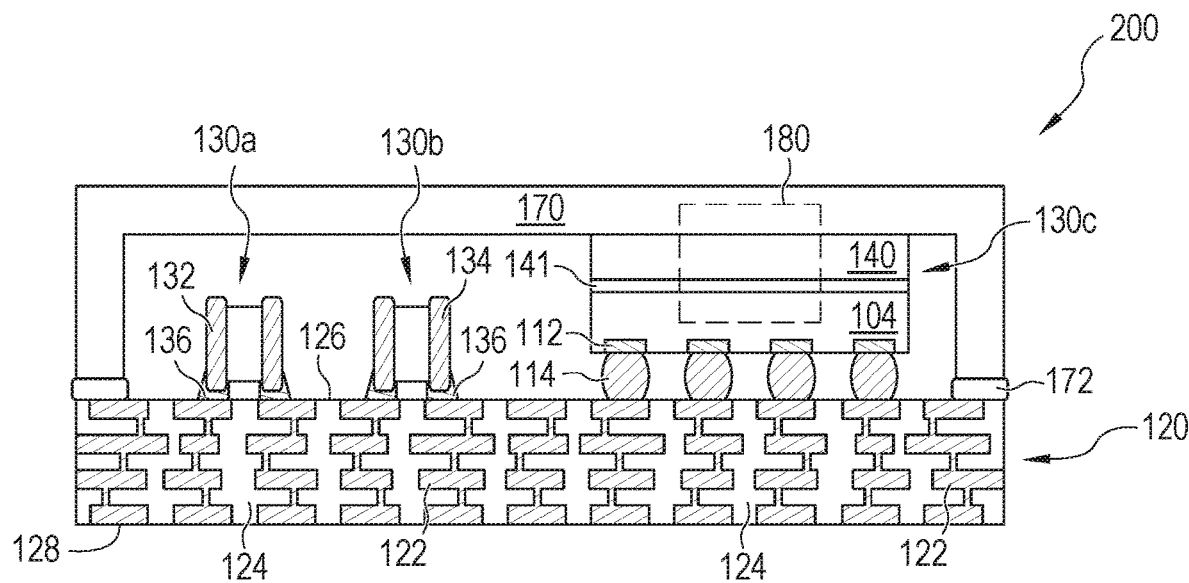
Figure 2G:
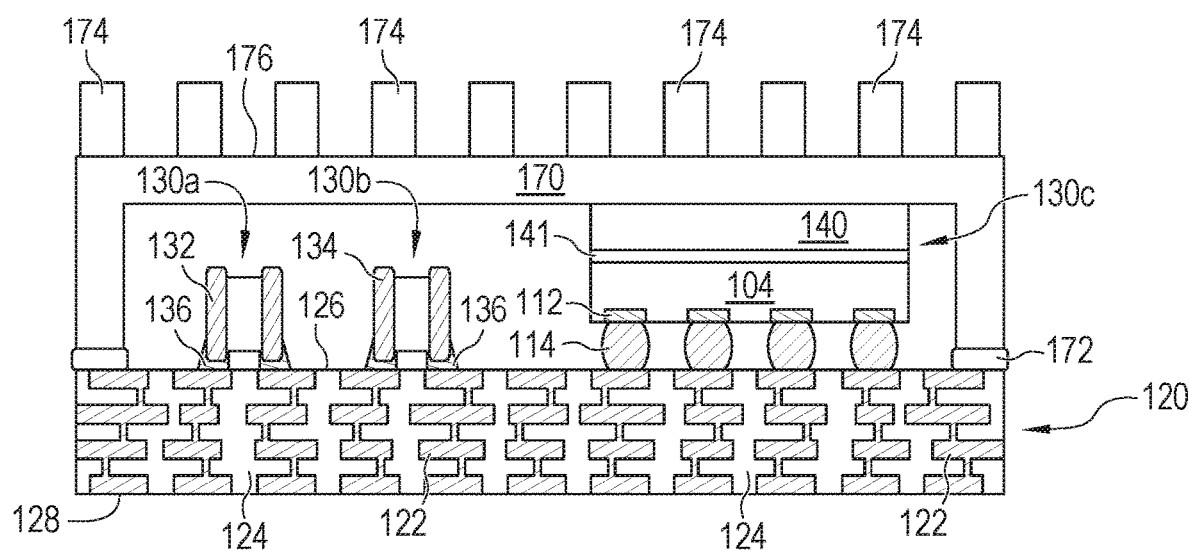

In FIG. 2e, heat sink or heat spreader 170 is disposed over electrical components 130a-130c, including TIM 140 deposited over electrical component 130c. Heat sink 170 can be one or more layers of Al, Cu, Sn, Ni, Au, Ag, or other suitable thermally conductive material. FIG. 2f illustrates heat sink 170 mounted to substrate 120 with paste 172 and cure. Heat sink 170 dissipates heat generated by electrical components 130a-130c, as transferred through graphene Cu core 156 and TIM 140 to the heat sink. Heat sink 170 may include extensions or tabs 174 extending vertical or perpendicular with respect to surface 176 of the heat sink, as in FIG. 2g. Extensions 174 provide additional surface area for heat dissipation.

Figure 4A:
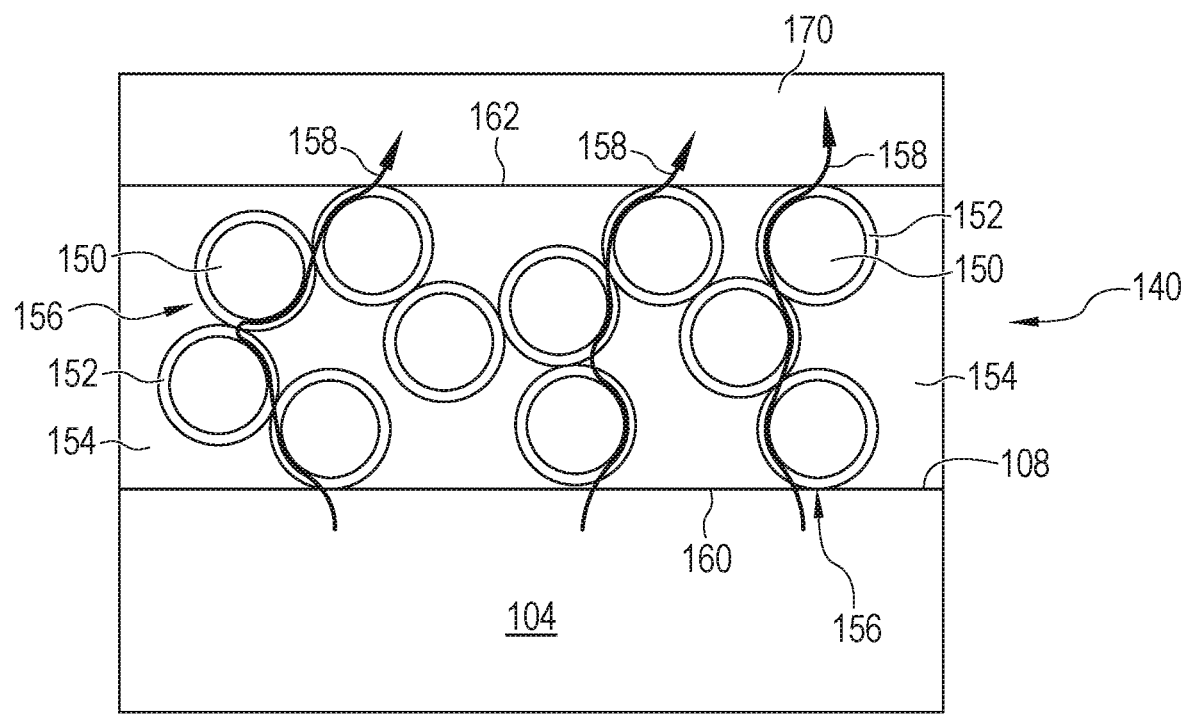
FIGS. 4a-4b illustrate further detail of forming the graphene Cu core within TIM.

FIG. 4a illustrates further detail within region 180 from FIG. 2f with TIM 140 deposited over electrical component 130c and heat sink 170 disposed over the TIM. TIM 140 including a plurality of metal cores 150 surrounded by graphene 152 embedded in thermoset material 154, see FIGS. 3a-3d. A plurality of graphene Cu cores 156 physically connects within thermoset material 154 to create a thermal path 158 including portions of interconnected graphene 152 on adjacent metal cores 150 disposed and extending between surface 160 and surface 162 of TIM 140. Heat from electrical component 130c is dissipated from surface 108 and surface 160 through thermal path 158 by way of connecting graphene Cu cores 156 to surface 162.

Figure 4B:
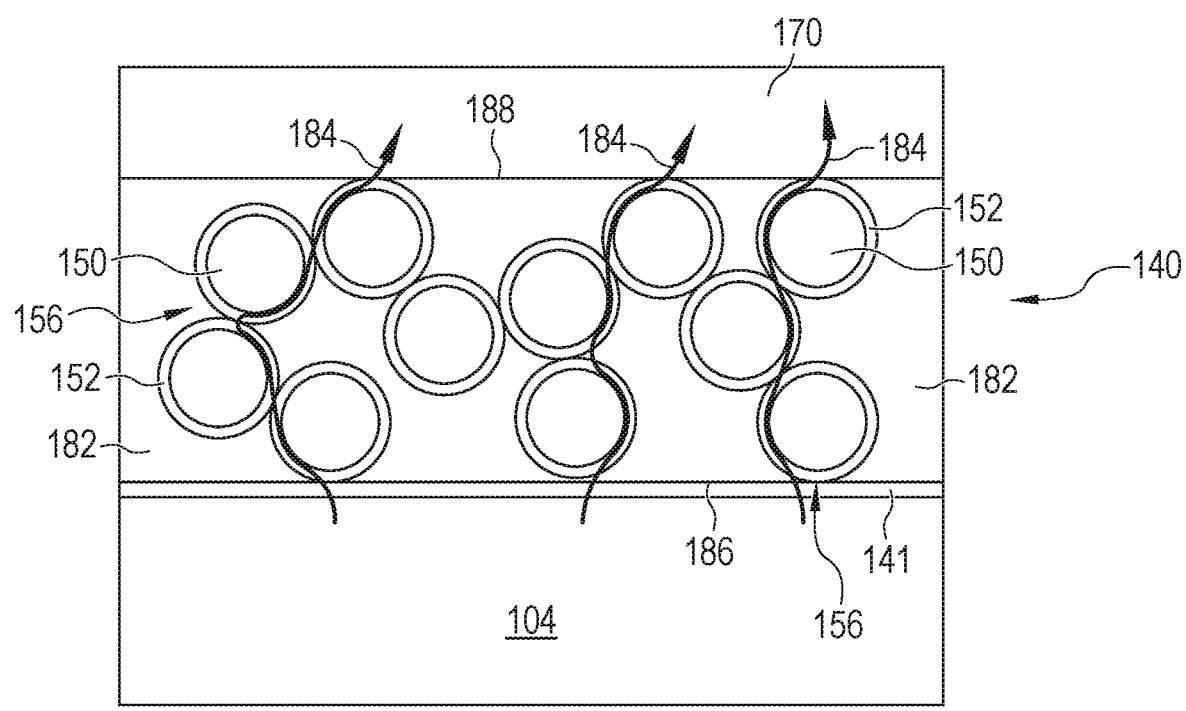

FIG. 4b illustrates another embodiment within region 180 with TIM 140 deposited over electrical component 130c and heat sink 170 disposed over the TIM. TIM 140 including a plurality of metal cores 150 surrounded by graphene 152 embedded in soldering type matrix 182. Soldering type matrix 182 can be indium (In) or InAg with a high thermal conductivity. In this case, metal coating 141 is formed over surface 108 of electrical component 130c, and soldering type matrix 182 is deposited over metal coating 141. A plurality of graphene Cu cores 156 physically connects within soldering type matrix 182 to create a thermal path 184 including portions of interconnected graphene 152 on adjacent metal cores 150 disposed and extending between surface 186 and surface 188 of TIM 140. Heat from electrical component 130c is dissipated from surface 108 and surface 186 through thermal path 184 by way of connecting graphene Cu cores 156 to surface 188.

The combination of interconnect substrate 120, electrical components 130a-130c, TIM 144 with graphene Cu core 156, and heat sink 170 constitute SiP 200. Graphene Cu core 156 aids with the heat transfer capability of SiP 200, particularly between electrical components 130a-130c, known to generate heat, and heat sink 150, useful to dissipate heat. Graphene 152 has a low moisture permeability and a high thermal conductivity of 4000-5000 W m$^{-1}$ K$^{-1}$, 10 times higher than Cu at room temperature. Since carbon also has a good solderability and wettability of solder paste, TIM 140 and heat sink 170 can be readily attached. Graphene 152 exhibits a high degree of flexibility and remains stable against warpage. Graphene 152 reduces or prevents oxidation. TIM 140 with graphene Cu core 156 improves thermal conductivity, while lowering manufacturing cost.

Figure 5:
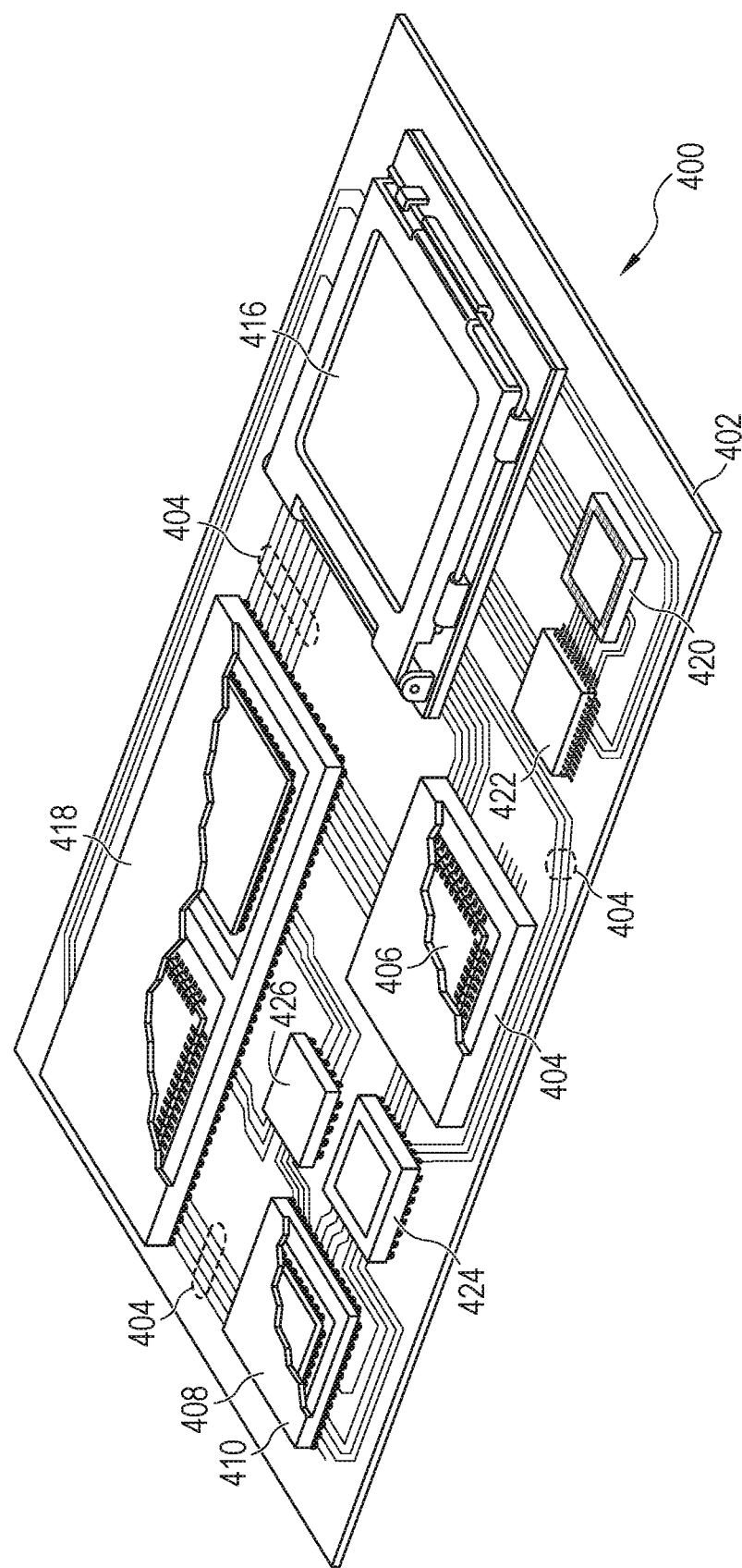
FIG. 5 illustrates a printed circuit board (PCB) with different types of packages disposed on a surface of the PCB.

FIG. 5 illustrates electrical device 400 having a chip carrier substrate or PCB 402 with a plurality of semiconductor packages disposed on a surface of PCB 402, including SiP 200. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   an electrical component disposed over the substrate;
   a thermal interface material (TIM) deposited over the electrical component, wherein the TIM includes a plurality of cores covered by graphene and the graphene is formed as a mesh network in a two-dimensional honeycomb lattice over the cores and the graphene over the cores is in contact continuously between a first surface of the TIM to a second surface of the TIM opposite the first surface of the TIM to form a thermal path through the continuous contact of the graphene over the cores within the TIM between the first surface of the TIM and the second surface of the TIM; and
   a heat sink disposed over the TIM.

2. The semiconductor device of claim 1, wherein the plurality of cores includes copper.

3. The semiconductor device of claim 1, wherein the TIM is printed on the electrical component.

4. The semiconductor device of claim 1, wherein the TIM includes thermoset material or soldering type matrix and the plurality of cores covered by graphene is embedded within the thermoset material or soldering type matrix.

5. The semiconductor device of claim 1, further including a metal layer between the TIM and electrical component.

6. A semiconductor device, comprising:
   an electrical component; and
   a thermal interface material (TIM) deposited over the electrical component, wherein the TIM includes a plurality of cores covered by graphene and the graphene over the cores is in continuous contact between a first surface of the TIM to a second surface of the TIM opposite the first surface of the TIM to form a thermal path through the continuous contact of the graphene over the cores within the TIM.

7. The semiconductor device of claim 6, further including:
   a substrate, wherein the electrical component is disposed over the substrate; and
   a heat sink disposed over the TIM.

8. The semiconductor device of claim 6, wherein the plurality of cores includes copper.

9. The semiconductor device of claim 6, wherein the TIM is printed on the electrical component.

10. The semiconductor device of claim 6, wherein the TIM includes thermoset material or soldering type matrix and the plurality of cores covered by graphene is embedded within the thermoset material or soldering type matrix.

11. The semiconductor device of claim 6, further including a metal layer between the TIM and electrical component.

12. The device of claim 6, wherein the graphene is formed as a mesh network in a two-dimensional honeycomb lattice over the cores.

13. A method of making a semiconductor device, comprising:
    providing a substrate;
    disposing an electrical component over the substrate;
    depositing a thermal interface material (TIM) over the electrical component, wherein the TIM includes a plurality of cores covered by graphene and the graphene over the cores is in contact continuously between a first surface of the TIM to a second surface of the TIM opposite the first surface of the TIM to form a thermal path through the continuous contact of the graphene over the cores within the TIM; and
    disposing a heat sink over the TIM.

14. The method of claim 13, wherein the plurality of cores includes copper.

15. The method of claim 13, further including printing the TIM on the electrical component.

16. The method of claim 13, wherein the TIM includes thermoset material or soldering type matrix and the plurality of cores covered by graphene is embedded within the thermoset material or soldering type matrix.

17. The method of claim 13, further including forming a metal layer between the TIM and electrical component.

18. The method of claim 13, wherein the graphene is formed as a mesh network in a two-dimensional honeycomb lattice over the cores.

19. A method of making a semiconductor device, comprising:
    providing an electrical component; and
    depositing a thermal interface material (TIM) over the electrical component, wherein the TIM includes a plurality of cores covered by graphene and the graphene over the cores is in continuous contact between a first surface of the TIM to a second surface of the TIM opposite the first surface of the TIM to form a thermal path through the continuous contact of the graphene over the cores within the TIM to dissipate heat from the electrical component.

20. The method of claim 19, further including:
    providing a substrate, wherein the electrical component is disposed over the substrate; and
    disposing a heat sink over the TIM.

21. The method of claim 19, wherein the plurality of cores includes copper.

22. The method of claim 19, further including printing the TIM on the electrical component.

23. The method of claim 19, wherein the TIM includes thermoset material or soldering type matrix and the plurality of cores covered by graphene is embedded within the thermoset material or soldering type matrix.

24. The method of claim 19, wherein the graphene is formed as a mesh network in a two-dimensional honeycomb lattice over the cores.

* * * * *